United States Patent
Paternoster et al.

(10) Patent No.: US 11,036,253 B1
(45) Date of Patent: Jun. 15, 2021

(54) DYNAMIC SCALING OF SYSTEM CLOCK SIGNAL IN RESPONSE TO DETECTION OF SUPPLY VOLTAGE DROOP

(71) Applicant: Microsoft Technology Licensing, LLC, Redmond, WA (US)

(72) Inventors: Paul Paternoster, Los Altos, CA (US); Sharat Ippili, Santa Clara, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/039,846

(22) Filed: Sep. 30, 2020

(51) Int. Cl.
| | |
|---|---|
| *H03L 7/099* | (2006.01) |
| *H03L 7/07* | (2006.01) |
| *H03L 7/097* | (2006.01) |
| *G06F 1/08* | (2006.01) |
| *G06F 1/10* | (2006.01) |

(52) U.S. Cl.
CPC ............... *G06F 1/08* (2013.01); *G06F 1/10* (2013.01); *H03L 7/07* (2013.01); *H03L 7/097* (2013.01); *H03L 7/0995* (2013.01)

(58) Field of Classification Search
CPC ..... G06F 1/08; G06F 1/10; H03L 7/07; H03L 7/097; H03L 7/0995
See application file for complete search history.

(56) References Cited

U.S. PATENT DOCUMENTS

| | | | |
|---|---|---|---|
| 7,567,140 B2 | 7/2009 | Kim | |
| 9,209,966 B1 | 12/2015 | Hossain et al. | |
| 9,766,649 B2 | 9/2017 | Felix et al. | |
| 9,948,108 B2 | 4/2018 | Eren et al. | |
| 10,707,877 B1* | 7/2020 | Majumder | ............... H03L 5/00 |
| 2004/0017234 A1 | 1/2004 | Tam et al. | |
| 2004/0183613 A1* | 9/2004 | Kurd | ............... G01R 19/16519 |
| | | | 331/186 |
| 2015/0214963 A1 | 7/2015 | Liu et al. | |

OTHER PUBLICATIONS

Cortadella, et al., "Reactive Clocks with Variability-Tracking Jitter", In Proceedings of 33rd IEEE International Conference on Computer Design (ICCD), Oct. 18, 2015, pp. 540-547.
Jalali, Mohammad Sadegh, "A Hybrid Phase-Locked Loop for Clock and Data Recovery Applications", In Thesis of the University of British Columbia, Aug. 2010, 165 Pages.
Subramanian, Ashwin Srinath, "Enhancing Microprocessor Power Efficiency Through Clock-Data Compensation", In Thesis of the Georgia Institute of Technology, Dec. 2015, 49 Pages.

\* cited by examiner

*Primary Examiner* — John W Poos

(57) ABSTRACT

A circuit includes a phase-locked loop configured to receive a reference clock signal and to generate a first clock signal having a first frequency. A secondary clock generation circuit is configured to generate a second clock signal having a second frequency lower than the first frequency. A voltage detection circuit is coupled to receive a supply voltage and configured to detect a droop in the supply voltage and generate a clock control signal in response to detecting a droop in the supply voltage. A selection circuit is coupled to the voltage detection circuit to receive the clock control signal and is configured to select one of the first clock signal and the second clock signal based on the clock control signal.

17 Claims, 9 Drawing Sheets

DYNAMIC SCALING OF SYSTEM CLOCK SIGNAL IN RESPONSE TO DETECTION OF SUPPLY VOLTAGE DROOP

BACKGROUND

The present disclosure relates generally to detection of variations in a supply voltage of an electronic system and mitigation techniques to compensate for such variations, and more particularly to controlling a frequency of a system clock signal to compensate for detected variations in a supply voltage.

Digital electronic circuits generally, and processors in particular, are sensitive to transient reductions in a supply voltage provided to power these circuits. Transient reductions or "droops" in the supply voltage can occur due to current spikes that arise from the switching of components in these circuits. For example, the switching of components in large blocks of digital circuitry during operation, or the activation of large blocks of digital circuitry from a standby or sleep mode of operation, can result in current spikes on a conductive node or plane providing the supply voltage that cause a droop in the supply voltage. These droops in the supply voltage are problematic for a variety of reasons. Delays in digital logic circuitry, for example, typically increase with reductions in supply voltage so that greater timing margins are required as supply voltage decreases.

Techniques to compensate for droop in a supply voltage are directed to either regulating the supply voltage in a way to reduce droop, or to dynamically reducing a frequency of a system clock signal when a droop is detected. In the latter approach, the frequency of the system clock signal is ideally reduced as quickly as possible in response to detecting a droop of the supply voltage. Delays in providing the system clock at the lower frequency can adversely affect the performance of the processor or other digital circuitry receiving the system clock signal.

In general, it would be advantageous to provide techniques and circuitry for quickly reducing the frequency of a system clock signal in response to detection of a droop in a supply voltage.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Features and advantages of the present disclosure include circuits for reducing a clock (e.g., a processor clock) in response to detecting a droop in a supply voltage. In one example embodiment, a processor may receive a power supply voltage. If the processor enters a state of high utilization, the power supply current of the processor may rapidly increase, causing a droop in the power supply voltage. In various embodiments, circuits according to the present disclosure may reduce the clock frequency of the processor, thereby reducing the processor supply current and allowing the power supply voltage to return to a nominal value. For instance, a phase locked loop (PLL) may produce a first clock signal having a first clock signal. A secondary clock generation circuit may produce a second clock signal having a second frequency. A voltage detection circuit may be coupled to the power supply voltage to detect the presence of voltage droop. Various embodiments may switch between the first clock signal and the second clock signal to change the processor clock frequency and allow the supply voltage to recover. For example, in one embodiment, if voltage droop is detected, the second clock signal having a lower frequency than the first clock signal may be selected and provided to the processor, for example, thereby reducing the frequency of the processor. In various example embodiments, the PLL may include a variable oscillator (e.g., a VCO) and the secondary clock generation circuit may include a replica oscillator. The secondary clock generation circuit may be configurable to produce a plurality of frequencies below the PLL frequency so that as the droop increases, the clock signal frequency produced by the system may decrease, and as the droop decreases and returns to a nominal value, the clock signal frequency may be increased back to the nominal value. In some example embodiments, the PLL may operate in a closed loop, and the secondary clock generation circuit may operate simultaneously in an open loop, allowing for fast switching between clock signal frequencies. Other features, advantages, and embodiments are described in more detail below.

Figure 1:
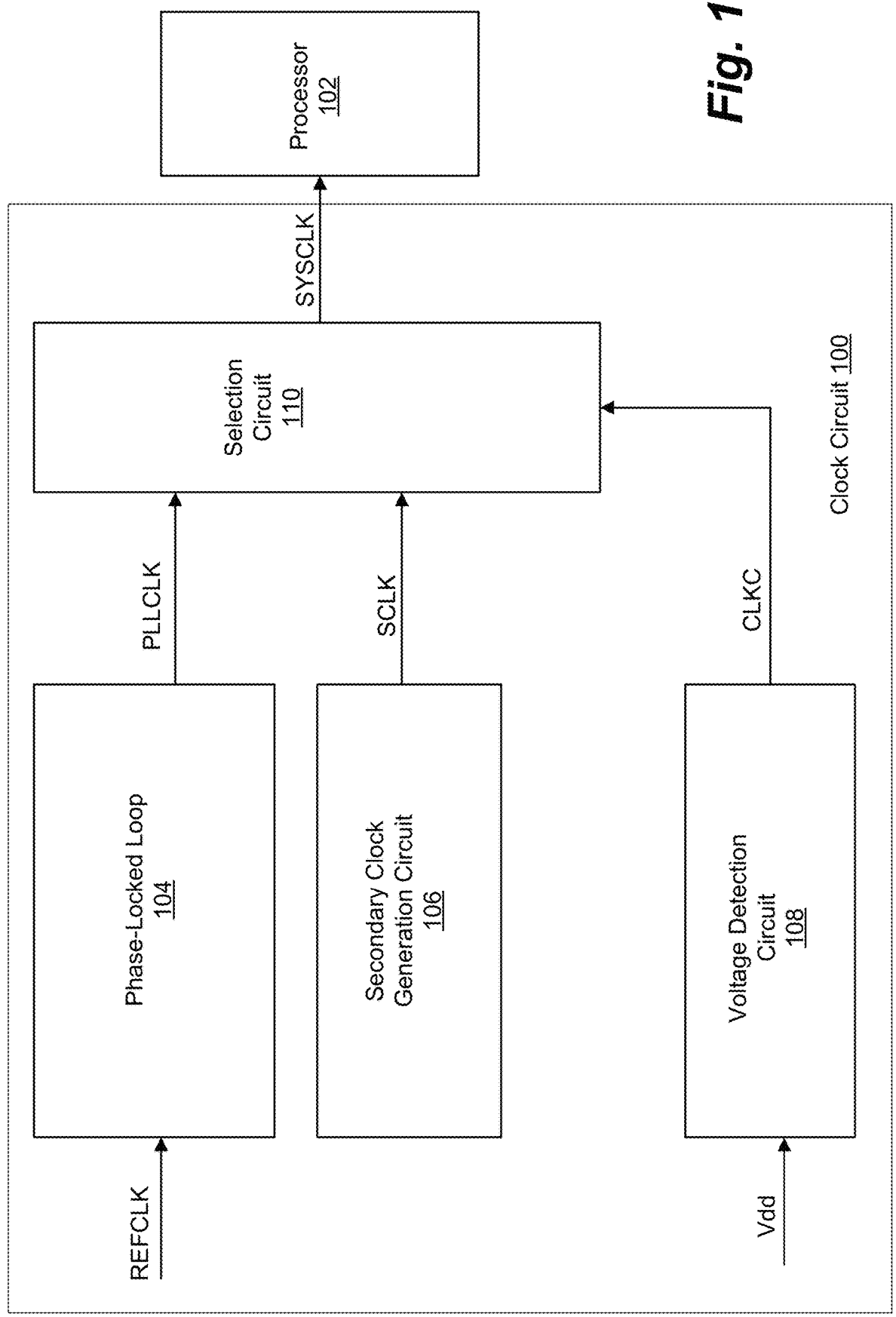
FIG. 1 is a functional block diagram of a clock circuit including a supply voltage detection circuit and providing a system clock signal to a processor according to one embodiment of the present disclosure.

FIG. 1 is a functional block diagram of a clock circuit 100 that generates a system clock signal SYSCLK supplied to clock a processor 102 and reduces a frequency of the SYSCLK signal in response to detecting a reduction or droop in a supply voltage Vdd according to one embodiment of the present disclosure. The clock generation circuit 100 includes a phase-locked loop (PLL) 104 that receives a reference clock signal REFCLK and generates a first clock signal, or PLL clock signal (PLLCLK), having a first frequency F1. The PLLCLK signal has a phase and frequency that are related to a phase and frequency of the REFCLK signal, as will be understood by those skilled in the art. A secondary clock generation circuit 106 generates a second clock signal SCLK having a second frequency F2. A voltage detection circuit 108 is coupled to receive a supply voltage Vdd and detects a reduction or droop in the supply voltage. Accordingly, voltage detection circuit 108 generates a clock control signal CLKC having a value indicating whether a droop on the supply voltage has been detected. A selection circuit 110 is coupled to the voltage detection circuit 108 to receive the clock control signal CLKC and selects, based on the clock control signal, one of the first clock signal PLLCLK from the PLL 104 and the second clock signal SCLK from the secondary clock generation circuit 106. The selection circuit 110 provides the selected PLLCLK or SCLK signal as the SYSCLK signal to clock the processor 102.

In various embodiments, at least one of the first frequency of the first clock signal from the PLL and the second frequency of the second clock signal from the secondary clock generation circuit are reduced when the voltage detection circuit detects a droop in the supply voltage. The selection circuit may switch between producing the first clock signal and the second clock signal in response to a control signal corresponding to a level of droop in the supply voltage from the voltage detection circuit. In some embodiments, when the supply voltage falls below a first threshold voltage, the voltage detection circuit causes the selection circuit to switch between producing the first clock signal having the first frequency to produce the second clock signal having the second frequency less than the first frequency. The second frequency may be further reduced as the droop increases, and the voltage detection circuit causes the selection circuit to switch back to the first clock signal having the first frequency when the supply voltage recovers and increases above the first threshold voltage, for example. In another embodiment, the first frequency of the first clock signal from the PLL is reduced from an initial frequency as the supply voltage decreases (e.g., 1.6 GHz to 1.5 GHz and further to 1.4 GHz). The frequency reductions may occur as the supply voltage falls below successive threshold voltages, for example. The secondary clock generation circuit may be turned on when the supply voltage recovers above a first threshold voltage. The selection circuit may switch from producing the first clock signal (having a reduced frequency, e.g., 1.5 GHz or 1.4 GHz) to produce the second clock signal having the second frequency equal to the initial frequency (e.g., 1.6 GHz) when the supply voltage recovers above the first threshold voltage. Next, the selection circuit may switch from producing the second clock signal to produce the first clock signal when the phase-locked loop has stabilized the first clock signal back to the initial frequency.

Referring again to FIG. 1, the following describes the operation of the system for one example embodiment. PLL 104 may generate the first clock signal PLLCLK that is provided to the selection circuit 110. At the same time, the secondary clock generation circuit 106 generates the second clock signal SCLK having second frequency F2 that is lower than the first frequency F1 of the PLLCLK signal, and the second clock signal is also provided to the selection circuit 110. The voltage detection circuit 108 senses supply voltage Vdd and generates the clock control signal CLKC having a value indicating whether a droop or reduction in the value of the supply voltage has been detected. As long as the voltage detection circuit 108 detects no droop in the supply voltage Vdd, the voltage detection circuit generates the clock control signal CLKC causing the selection circuit 110 to select the first clock signal PLLCLK provided by the PLL 104 and output this first clock signal as the system clock signal SYSCLK to clock the processor 104.

When the voltage detection circuit 108 detects a droop in the supply voltage Vdd, the voltage detection circuit generates the clock control signal CLKC causing the selection circuit 110 to select the second clock signal SCLK provided by secondary clock generation circuit 106 and output this second clock signal as the system clock signal SYSCLK. In this way, the second clock signal SCLK having the lower frequency F2 is supplied as the system clock signal SYSCLK to clock the processor 102 and ensures proper operation of thereof when a droop in the supply voltage Vdd is detected. The second clock signal SCLK is provided as the system clock signal SCLK for the duration of the droop in the supply voltage Vdd. Once the voltage detection circuit 108 detects that the droop in the supply voltage Vdd is no longer present, the voltage detection circuit generates the clock control signal CLKC causing the selection circuit 110 to once again output the first clock signal PLLCLK having the higher frequency F1 to clock the processor 102. Advantageously, both PLLCLK and SCLK are running and available for selection if a droop is detected. Accordingly, when a droop is detected, SYSCLK may be quickly reduced with minimal impact to the processor, for example. In one example embodiment, PLL 104 is a closed loop but secondary clock generation circuit 106 is in an open loop and may contain replica components to PLL 104 (e.g., a PLL variable oscillator and a replica oscillator), for example, to improve switchover speed and accuracy of the clock.

Figure 2A:
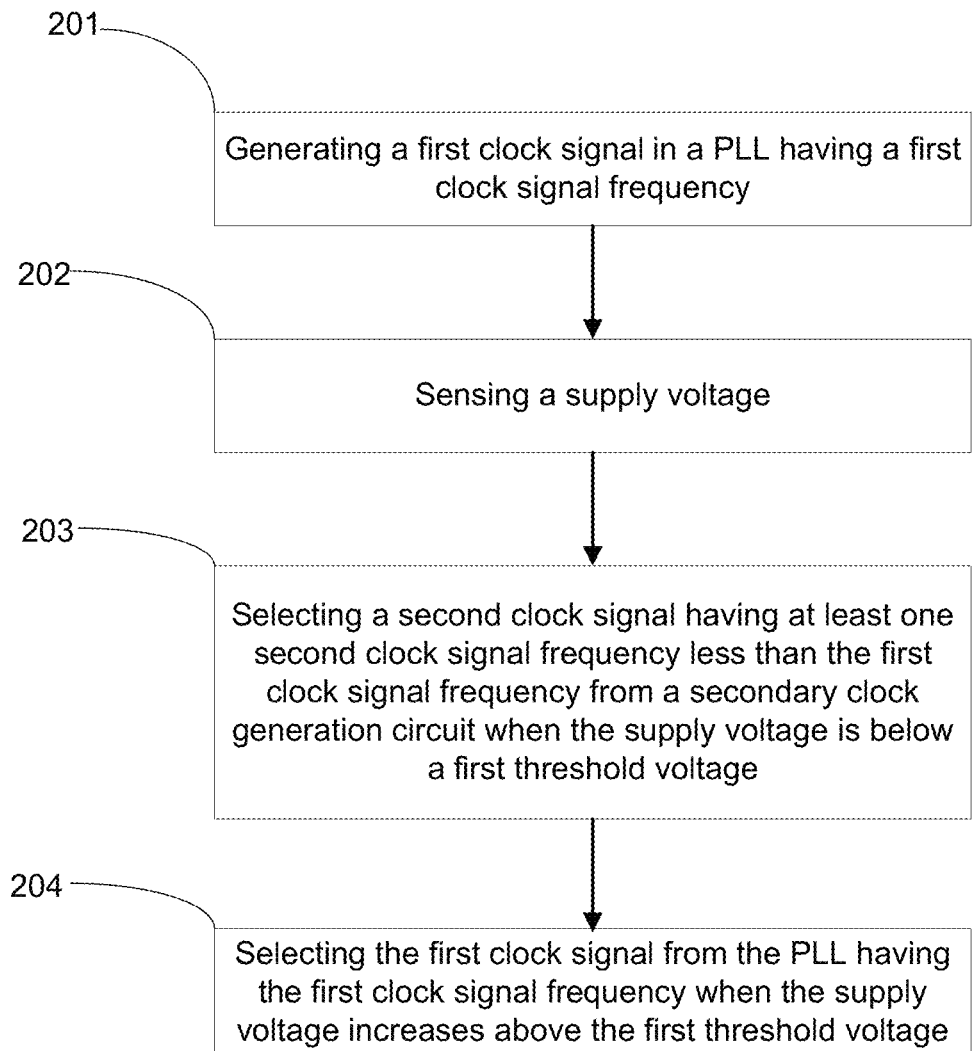
FIG. 2A is a flowchart illustrating a method of generating a clock based upon detection of a droop in a supply voltage according to an embodiment of the present disclosure.

FIG. 2A illustrates reducing a clock frequency based on voltage droop according to one embodiment. At 201, a first clock signal is generated in a PLL having a first clock signal frequency. At 202, a supply voltage is sensed (e.g., by a voltage detection circuit). At 203, a second clock signal from a secondary clock generation circuit is selected when the supply voltage is below a first threshold voltage. The second clock signal has at least one second clock signal frequency less than the first clock signal frequency. In various embodiments described in more detail below, the second clock signal frequency may be further reduced if the droop increases, for example. At 204, the first clock signal from the PLL having the first clock signal frequency is selected when the supply voltage increases above the first threshold voltage, which may indicate that the supply voltage has recovered from a droop condition, for example.

Figure 2B:
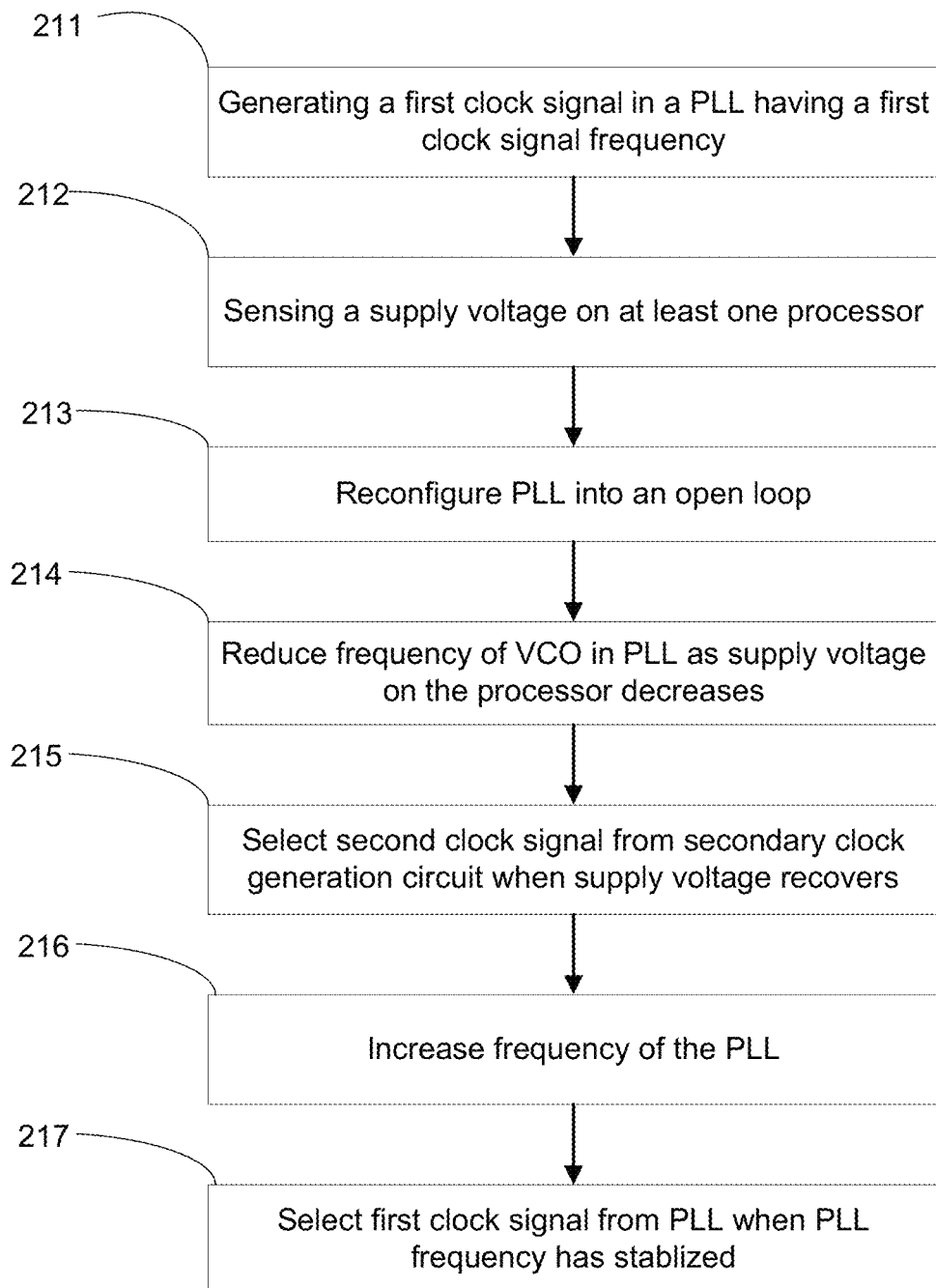
FIG. 2B is a flowchart illustrating a method of generating a clock based upon detection of a droop in a supply voltage according to another embodiment of the present disclosure.

FIG. 2B illustrates reducing a clock frequency based on voltage droop according to another embodiment. In this example, the PLL frequency is reduced, and the secondary clock generation circuit may be turned on during recovery until the PLL is able stabilize back to the initial (or nominal) frequency (e.g., 1.6 GHz). For example, at 211, a first clock signal in a PLL having a first clock signal frequency (e.g., 1.6 GHz) is generated. At 212, a supply voltage on at least one processor is sensed. At 213, the PLL may be reconfigured into an open loop, for example. At 214, the frequency of a voltage-controlled oscillator (VCO) in the PLL is reduced as the supply voltage on the processor decreases. For example, in one example embodiment, the system may break the PLL loop and send digital codes to a digital to analog converter (DAC) in the main PLL loop to cause the PLL to produce successively lower frequencies (e.g., 1.5 GHz and then 1.4 GHz). In one example implementation, the secondary clock generation circuit (e.g., a replica VCO therein) may be turned on and the second frequency of the second clock signal may be set to the initial frequency (e.g., 1.6 GHz) when a supply voltage droop is detected (e.g., and otherwise the secondary clock generation circuit is off to save power). At 215, the second clock signal from the secondary clock generation circuit is selected when the supply voltage recovers. At 216, the PLL loop may be closed and the frequency of the PLL is increased back to the initial frequency (e.g., 1.6 GHz). At 217, the first clock signal from the PLL is selected when the PLL has stabilized to the initial frequency.

Figure 2C:
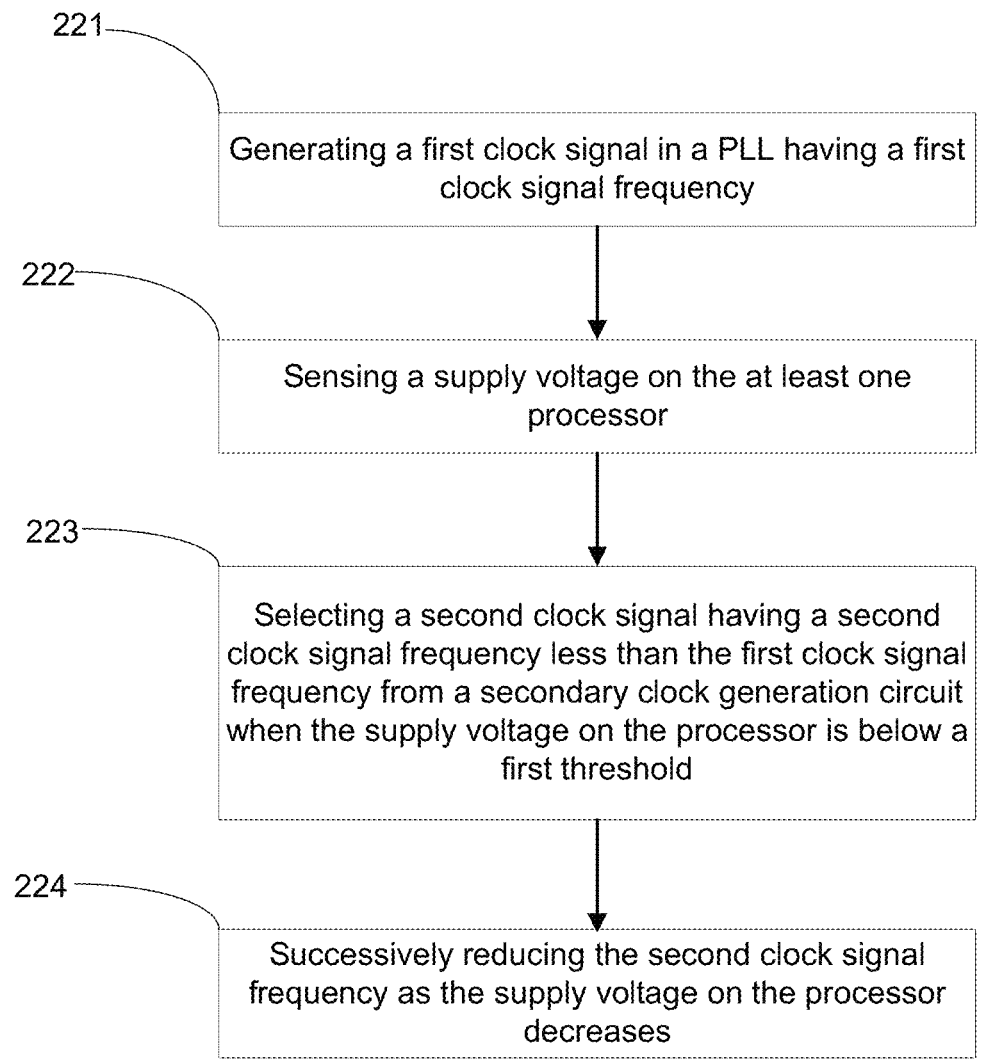
FIG. 2C is a flowchart illustrating a method of generating a clock based upon detection of a droop in a supply voltage according to yet another embodiment of the present disclosure.

FIG. 2C is a flowchart illustrating a process of generating a clock signal based upon detection of a droop in a supply voltage Vdd according to another embodiment of the present disclosure. The process begins at step 221 in which the process generates a first clock signal in a phase-locked loop having a first clock signal frequency. From step 221, the process goes to step 222 and senses the supply voltage Vdd on at least one processor. After step 222, the process goes to step 223 and selects a second clock signal having a second clock signal frequency less than the first clock signal frequency from a secondary clock generation circuit when the supply voltage Vdd on the processor is below a first voltage threshold. From step 223 the process goes to step 224 and successively reduces the frequency of the second clock signal as the supply voltage Vdd on the processor decreases. In one example embodiment, the second clock signal frequency is reduced between a plurality of discrete clock signal frequencies as the supply voltage Vdd on the processor decreases. In a further example embodiment, the process, in response to a reduction in the supply voltage Vdd, modifies a digital input to a digital-to-analog converter (DAC) to change a control input signal coupled to a variable oscillator in the secondary clock generation circuit, and in accordance therewith, reduces the frequency of the second clock signal.

Figure 3:
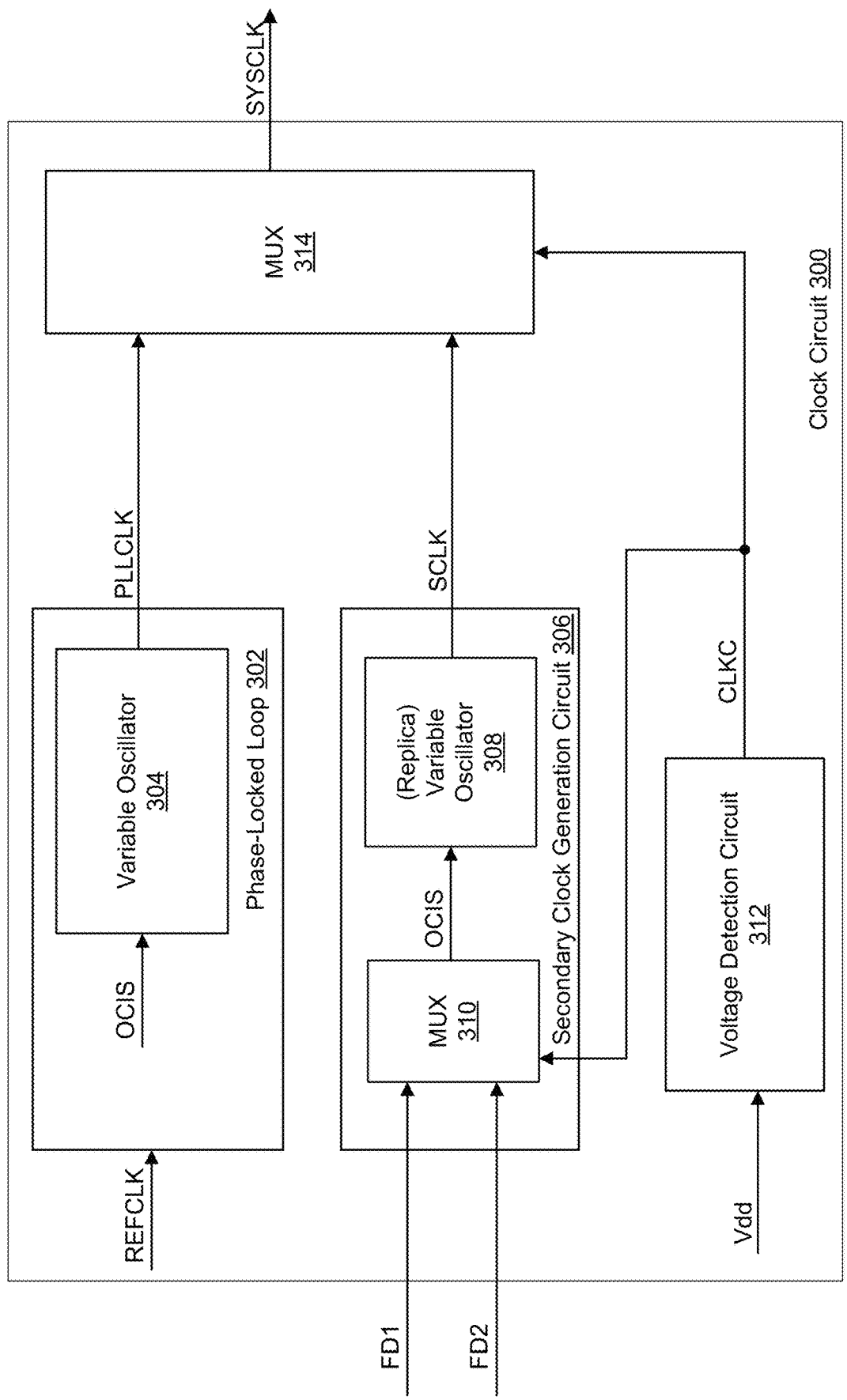
FIG. 3 is a functional block diagram of a clock circuit that controls a frequency of a system clock signal based on detection of a droop in a supply voltage according to a further embodiment of the present disclosure.

FIG. 3 is a functional block diagram of a clock circuit 300 that controls a frequency of a system clock signal SYSCLK based on detection of a droop in a supply voltage Vdd according to a further embodiment of the present disclosure. The clock generation circuit 300 includes a PLL 302 that receives a reference clock signal REFCLK and includes a variable oscillator 304 that generates a first clock signal, or PLL clock signal (PLLCLK), having a first frequency F1. The PLL 302 includes a variable oscillator 304 that receives an oscillator input control signal OCIS having a value that determines the frequency F1 of the PLLCLK signal. Thus, the variable oscillator 304 generates the PLLCLK signal having a frequency corresponding to the value of the OCIS signal. In operation, the PLL 302 compares the phase of the PLLCLK signal to the phase of the REFCLK signal and generates the OCIS signal based on this comparison. The OCIS signal has a value that causes the variable oscillator 304 to generate the PLLCLK signal having a phase and frequency that are related to the phase and frequency of the REFCLK signal.

A secondary clock generation circuit 306 generates a second clock signal SCLK having a second frequency F2 that is less than the first frequency F1 of the PLLCLK signal. In the embodiment of FIG. 3, the secondary clock generation circuit 306 also includes variable oscillator 308 that generates the SCLK signal. In some example embodiments, variable oscillator 308 may be a replica of variable oscillator 304 and may include the same circuit components, and may have the same structure, as the variable oscillator 304 in the PLL 302, for example. In various embodiments, secondary clock generation circuit 306 may be implemented according to a variety of techniques. For example, as described in more detail below, secondary clock generation circuit 306 may be implemented as an open loop circuit. In other embodiments, secondary clock generation circuit 306 may be implemented a second phase locked loop, for example.

Referring again to FIG. 3, in this example a multiplexer 310 in the secondary clock generation circuit 306 receives first and second frequency drive signals FD1 and FD2 having values that produce respective frequencies of the SCLK signal generated by the variable oscillator 308. A voltage detection circuit 312 is coupled to receive a supply voltage Vdd and detects a droop in the supply voltage, and generates a clock control signal CLKC based on whether a droop is detected. The clock control signal CLKC is applied to the multiplexer 310 to control selection of either the first or second frequency drive signal FD1, FD2. A multiplexer 314 also receives the clock control signal CLKC generated by the voltage detection circuit 312 and, in response to the clock control signal, outputs as the system clock signal SYSCLK either the first clock signal PLLCLK from the PLL 302 or the second clock signal SCLK from the secondary clock generation circuit 306.

In operation, the PLL 302 generates the first clock signal PLLCLK having the first frequency F1. Accordingly, when there is no droop in the supply voltage Vdd, the clock control signal CLKC causes the multiplexer 314 select PLLCKK and provide this first clock signal as the system clock signal SYSCLK. The clock control signal CLKC is also supplied to the secondary clock generation circuit 306 to control the value of the second frequency F2 of the second clock signal SCLK, as will be described in more detail below. However, when the voltage detection circuit 312 detects a droop in the supply voltage Vdd, the voltage detection circuit generates the clock control signal CLKC causing the multiplexer 314 to select the second clock signal SCLK provided by secondary clock generation circuit 306 and output this second clock signal as the system clock signal SYSCLK. In this way, the second clock signal SCLK having a lower frequency F2 is supplied as the system clock signal SYSCLK if a droop in the supply voltage Vdd is detected to ensure proper operation of circuitry (not shown) being clocked by the SYSCLK signal.

Features and advantages of the present disclosure may further include successively reducing the clock frequency as the supply voltage reduces. For example, in the embodiment of FIG. 3, the voltage detection circuit 312 further detects whether the value of the supply voltage Vdd has drooped below a multiple threshold values—e.g., a high voltage threshold value and a low voltage threshold value. When the voltage detection circuit 312 detects the supply voltage Vdd has drooped below the high voltage threshold value, the voltage detection circuit generates the clock control signal CLKC causing the multiplexer 310 to supply the first frequency drive signal FD1 as the oscillator control input signal OCIS to the variable oscillator 308. In response to the value of the first frequency drive signal FD1, the variable oscillator 308 generates the second clock signal SCLK having an initial value for the frequency F2. If the voltage detection circuit 312 detects the supply voltage Vdd has drooped below the low voltage threshold value, the voltage detection circuit generates the clock control signal CLKC causing the multiplexer 310 to supply the second frequency drive signal FD2 as the oscillator control input signal OCIS to the variable oscillator 308. In response to the value of the second frequency drive signal FD2, the variable oscillator 308 generates the second clock signal SCLK having a lower value for the frequency F2. Thus, when the supply voltage Vdd drops below the high voltage threshold value the secondary clock generation circuit 306 generates the second clock signal SCLK having the initial value for the frequency F2 and when the supply voltage drops below the low voltage threshold value the secondary clock generation circuit generates the second clock signal SCLK having the lower value for the frequency F2.

In the embodiment of FIG. 3, the variable oscillator 308 generates the second clock signal SCLK having a variable frequency F2 where the value of this variable frequency is reduced as the supply voltage Vdd decreases. In this way, the secondary clock generation circuit 306 successively reduces the frequency F2 of the second clock signal SCLK as the level of the supply voltage Vdd decreases. The secondary clock generation circuit 312 accordingly generates a plurality of clock signal frequencies for the second clock signal SCLK in response to the clock control signal CLKC provided by the voltage detection circuit 312. In a further embodiment, the voltage detection circuit 312 may detect N levels of droop in the supply voltage Vdd, where N>2. In such an embodiment, N frequency drive signals FD1-FDN (not shown in FIG. 3) would be supplied to multiplexer 310. The voltage detection circuit 312 would generate the clock control signal CLKC causing the multiplexer 310 to select one of the N frequency drive signals FD1-FDN to be supplied as the oscillator control input signal OCIS to the variable oscillator 308 to thereby control the frequency of the SCLK signal. The N frequency drive signals FD1-FDN would have values to successively reduce the frequency F2 of the SCLK signal as the respective frequency drive signals are successively selected.

The clock circuit 300 provides the second clock signal SCLK as the system clock signal SCLK for the duration of the detected droop in the supply voltage Vdd. Once the voltage detection circuit 312 detects that the droop in the supply voltage Vdd is no longer present, the voltage detection circuit generates the clock control signal CLKC causing the multiplexer 314 to once again output the first clock signal PLLCLK having the higher frequency F1 generated by the PLL 302.

Figure 4:
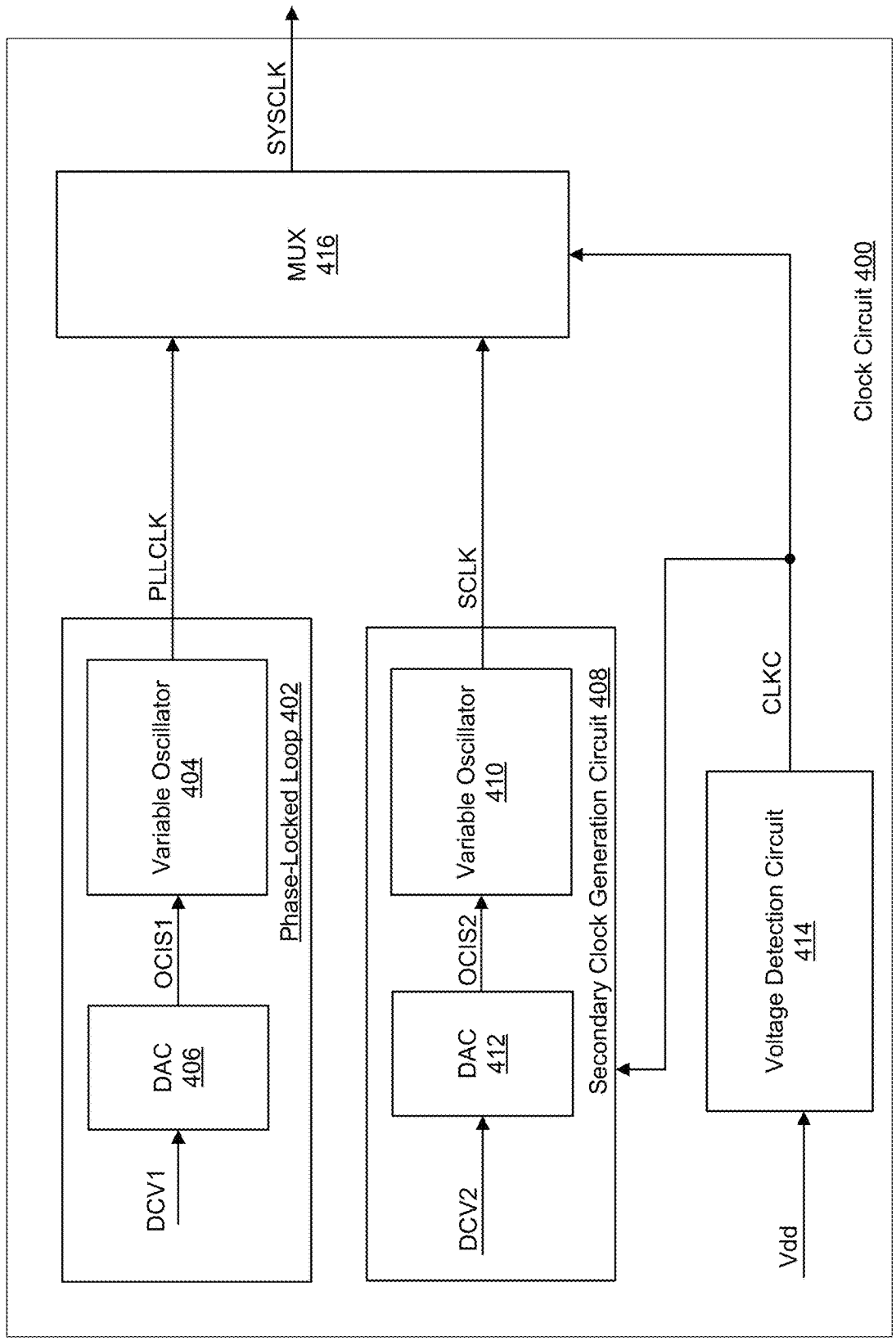
FIG. 4 is a functional block diagram of a clock circuit that controls a frequency of a system clock signal based on detection of a droop in a supply voltage according to a still further embodiment of the present disclosure.

FIG. 4 is a functional block diagram of a clock circuit 400 that controls a frequency F1 of a system clock signal SYSCLK based on detection of a droop in a supply voltage Vdd according to a still further embodiment of the present disclosure. The clock generation circuit 400 includes a PLL 402 having a variable oscillator 304 that generates a first clock signal or PLL clock signal PLLCLK having a first frequency F1. The variable oscillator 404 receives a first oscillator input control signal OCIS1 having a value that determines the frequency F1 of the PLLCLK signal. The variable oscillator 404 accordingly generates the PLLCLK signal having the frequency determined by the value of the OCIS1 signal. In the embodiment of FIG. 4, a digital-to-analog converter (DAC) 406 provides the oscillator input control signal OCIS1 to the variable oscillator 404. The DAC 406 generates the OCIS1 signal in response to a first digital control value signal DCV1 supplied to the DAC. The PLL 402 includes control loop circuitry (not shown) that generates the first digital control value signal DCV1 having a value that causes the DAC 406 to provide the OCIS1 signal with a value that causes the variable oscillator 404 to generate the PLLCLK signal having the proper phase and frequency, as will be understood by those skilled in the art.

A secondary clock generation circuit 408 generates a second clock signal SCLK having a second frequency F2 that is less than the first frequency F1 of the PLLCLK signal. In the embodiment of FIG. 4, the secondary clock generation circuit 306 includes a variable oscillator 410 that generates the SCLK signal and a DAC 412 that supplies a second oscillator control input signal OCIS2 to the variable oscillator. The DAC 412 generates the OCIS2 signal in response to a second digital control value signal DCV2 supplied to the DAC. Unlike in the PLL 402 where internal control circuitry of the PLL generates the first DCV1 signal, the secondary clock generation circuit 408 generates the second clock signal SCLK in an open-loop manner, with the frequency F2 of the SLCK signal having a value based on the value of the second DCV2 signal, which is determined by circuitry external to the secondary clock generation circuit, as described in more detail below.

A voltage detection circuit 414 is coupled to receive a supply voltage Vdd and operates to detect a droop in the supply voltage. The voltage detection circuit 404 generates a clock control signal CLKC having a value based on the detected droop. The clock control signal CLKC is applied to the secondary clock generation circuit 408 to set the value of the second digital control value DCV2 applied to the DAC 412. A multiplexer 416 also receives the clock control signal CLKC generated by the voltage detection circuit 414 and, in response to the clock control signal, outputs as the system clock signal SYSCLK either the first clock signal PLLCLK from the PLL 402 or the second clock signal SCLK from the secondary clock generation circuit 408. In one embodiment of the clock circuit 400, the variable oscillators 404 and 410 are current-controlled oscillators. The first and second oscillator control input signals OCIS1 and OCIS2 are accordingly suitable currents generated by the DAC 406 and DAC 412, respectively, in this embodiment. The variable oscillators 404 and 410 may be ring oscillators in this embodiment, and may be ring oscillators in other embodiments of clock circuits described herein as well. In the clock circuit 400, each of the first and second digital control value signals DCV1 and DCV2 is of course a digital signal having M-bits, which may vary depending on the specific structure of the DAC 406 and DAC 412.

In operation of the clock circuit 400, the PLL 402 generates the first clock signal PLLCLK having the first frequency F1 and when there is no droop in the supply voltage Vdd the multiplexer 416 provides this first clock signal as the system clock signal SYSCLK. In this situation the voltage detection circuit 414 detects no droop in the supply voltage Vdd, and in response to detecting no droop the voltage detection circuit generates the clock control signal CLKC causing the multiplexer 416 to provide the PLLCLK signal. The clock control signal CLKC is also supplied to the secondary clock generation circuit 408 to control the value of the second frequency F2 of the second clock signal SCLK, as will be described in more detail below. As long as the voltage detection circuit 414 detects no droop in the supply voltage Vdd, the voltage detection circuit generates the clock control signal CLKC causing the multiplexer 416 to select the first clock signal PLLCLK and output this first clock signal as the system clock signal SYSCLK.

When the voltage detection circuit 414 detects a droop in the supply voltage Vdd, the voltage detection circuit generates the clock control signal CLKC causing the multiplexer 416 to select the second clock signal SCLK provided by secondary clock generation circuit 408, and to output this second clock signal as the system clock signal SYSCLK. In this way, the second clock signal SCLK having a lower frequency F2 is supplied as the system clock signal SYSCLK if a droop in the supply voltage Vdd is detected to ensure proper operation of circuitry (not shown) being clocked by the SYSCLK signal.

In the embodiment of FIG. 4, the voltage detection circuit 414 detects whether the value of the supply voltage Vdd has drooped below, or is less than, at least two different voltage threshold values. When the voltage detection circuit 414 detects the supply voltage Vdd has drooped below one or more of these multiple voltage threshold values, the voltage detection circuit generates the clock control signal CLKC that causes the second digital control value signal DCV2 to be set to a value corresponding to the desired value of the frequency F2 of the second clock signal SCLK. In response the CLKC signal and the corresponding value of the DCV2 signal, the DAC 412 generates the OCIS signal having a value that causes the variable oscillator 410 to generate the second clock signal SCLK having the frequency F2 with a value corresponding to the value of the OCIS signal as set by the corresponding value of the DCV2 signal.

In operation, the voltage detection circuit 414 adjusts the value of the clock control signal CLKC in response to a level of the droop in the supply voltage Vdd as determined by the at least two voltage threshold values. As the voltage detection circuit 414 adjusts the value of the CLKC signal the value of the DCV2 signal is adjusted accordingly, causing the secondary clock generation circuit 408 to generate the SCLK signal having the desired value for the frequency F2. In this way, the frequency F2 of the SCLK signal is adjusted based on the level of droop of the supply voltage Vdd. The frequency F2 of the SCLK signal, regardless of its specific value, is always less than the frequency F1 of the PLLCLK signal. The specific value of the frequency F2, however, may be increase or decrease as a function of the level of droop in the supply voltage Vdd detected by the voltage detection circuit 414.

The clock circuit 400 provides the second clock signal SCLK as the system clock signal SCLK for the duration of the detected droop in the supply voltage Vdd. Once the voltage detection circuit 414 detects that the droop in the supply voltage Vdd is no longer present, the voltage detection circuit generates the clock control signal CLKC causing the multiplexer 416 to once again output the first clock signal PLLCLK having the higher frequency F1 as generated by the PLL 302. Upon occurrence of a droop in the supply voltage Vdd, the clock circuit 400 will clock circuitry (not shown in FIG. 3) with the secondary clock signal SCLK having the variable frequency F2 that is less than the frequency F1 of the PLLCLK signal generated by the PLL 302. The specific value of the variable frequency F2 as set by the value of the DCV2 signal is based on the level of droop in the supply voltage Vdd.

Figure 5:
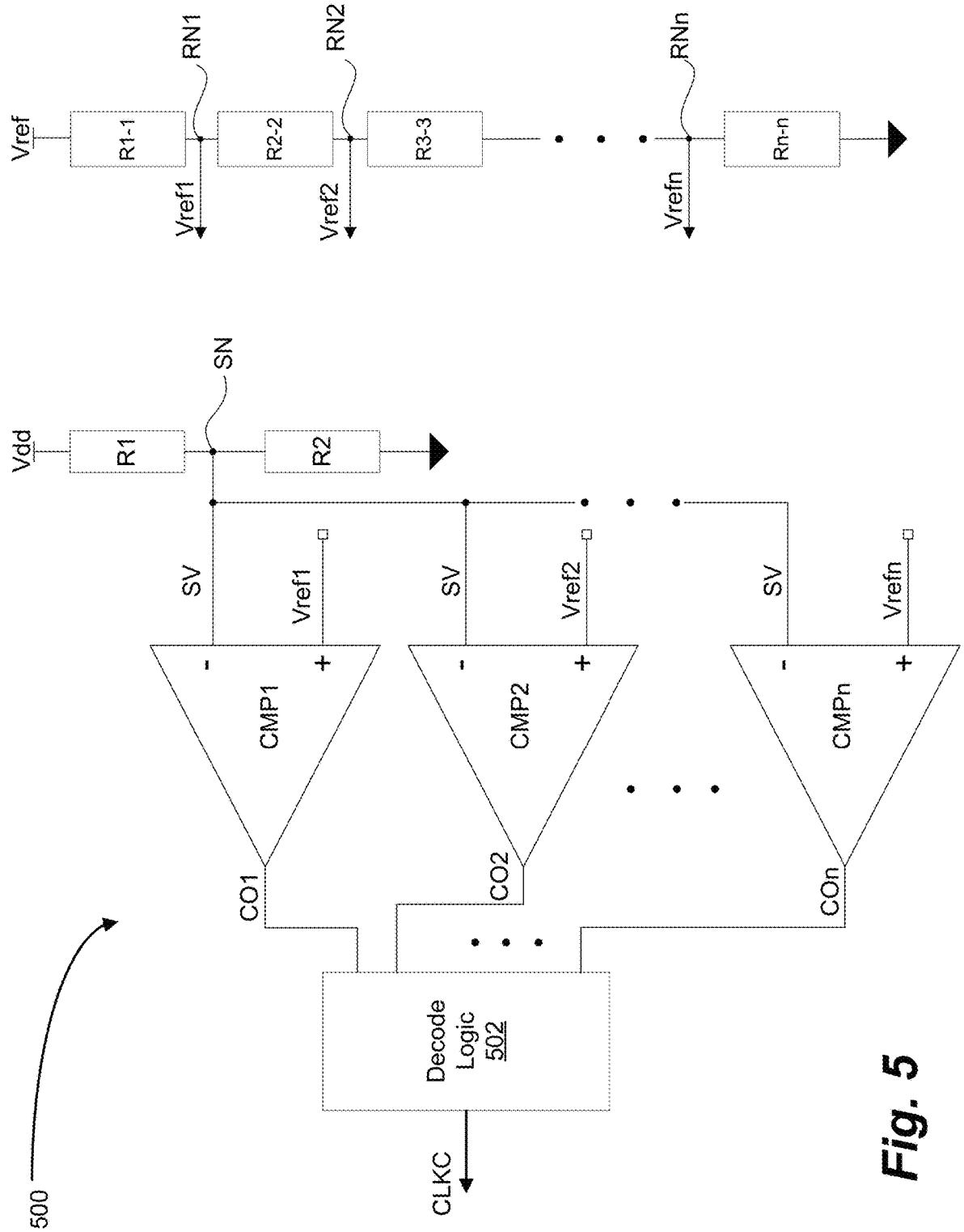
FIG. 5 is a functional schematic diagram of a voltage detection circuit according to an embodiment of the present disclosure.

FIG. 5 is a functional schematic diagram of a voltage detection circuit 500 according to one embodiment of the present disclosure. The voltage detection circuit 500 may form at least part of the circuitry contained in embodiments of the voltage detection circuits 108, 312 and 414 of FIGS. 1, 3 and 4. The voltage detection circuit 500 includes a group of reference resistors R1-1 to Rn-n coupled in series between a voltage node receiving a reference voltage Vref and a reference voltage node receiving a ground reference voltage. Reference nodes RN1-RNn are defined at interconnections of each of the resistors R1-1 to Rn-n. Reference voltages Vref1-Vrefn are generated on the reference nodes RN1 to RNn, each of the reference voltages having a value that is a function of the value of the reference voltage Vref. The reference voltage Vref is a stable reference voltage, meaning this reference voltage does not experience variations or droop when the supply voltage Vdd experiences droop.

The voltage detection circuit 500 further includes a voltage divider including resistors R1 and R2 coupled in series between a supply voltage node receiving the supply voltage node Vdd and a reference voltage node receiving a ground reference voltage. A sensing node SN is defined at the interconnection of the resistors R1 and R2 and a sensing voltage SV generated on the sensing node. The sensing voltage SV has a value that is a function of the value of the supply voltage Vdd. A group of comparators CMP1-CMPn have inputs coupled to the reference resistors R1-1 to Rn-n and the sensing node SN. More specifically, each of the comparators CMP1-CMPn has an inverting input coupled to the sensing node SN to receive the sensing voltage SV. A non-inverting input of each of the comparators CMP1-CMPn is coupled to a corresponding one of the reference nodes RN1-RNn to receive the corresponding reference voltage Vref1-Vrefn. The comparators CMP1-CMPn generate corresponding output signals CO1-COn based on the sensing voltage SV and the corresponding reference voltage Vref1-Vrefn present on the inputs of each of the comparators. These output signals CO1-CO are provided to decode logic 502, which generates the clock control signal CLKC in response to the output signals, as will be described in more detail below.

In operation, each of the comparators CMP1-CMPn compares the corresponding reference voltage Vref1-Vrefn to the sensing voltage SV, and generates the corresponding output signal CO1-COn indicating the results of the comparison. As mentioned above, the reference voltage Vref is a stable reference voltage and thus each of the reference voltages Vref1-Vrefn is also a stable reference voltage and thus will not experience variations or droop when the supply voltage Vdd experiences droop. In contrast, the value of the sensing voltage SV will vary as the value of the supply voltage Vdd varies. Thus, a droop in the value of the supply voltage Vdd results in a droop or decrease in the values of the sensing voltage SV. The extent or magnitude of the droop in the supply voltage Vdd determines the extent or magnitude of the decrease or droop in the sensing voltage SV.

In the embodiment of FIG. 5, the reference voltage Vref1>Vref2>Vref3>Vrefn. As a result, the greater the magnitude of the droop in the supply voltage Vdd the greater the number of comparators CMP1-CMPn that activate the corresponding output signal CO1-COn. For example, if the droop in the supply voltage Vdd results in the sensing voltage SV dropping below the first reference voltage Vref1 but remaining greater than the second reference voltage Vref2, the comparator CMP1 activates the output signal CO1 while the remaining comparators CMP2-CMPn continue driving the output signals CO2-COn inactive. If the droop in the supply voltage Vdd then increases further resulting in the sensing voltage SV dropping below the second reference voltage Vref2 supplied to the second comparator CMP2, the second comparator will now activate the output signal CO2 while the remaining comparators CMP3-CMPn continue driving the output signals CO3-COn inactive. The lower the droop in the supply voltage Vdd the greater the number of comparators CMP1-CMPn that activate the corresponding output signals CO1-COn.

The decode logic 502 receives the output signals CO1-COn from the comparators CMP1-CMPn and decodes these output signals to generate the clock control signal CLKC. The specific decoding performed by the decode logic 502 and the characteristics of the generated clock control signal CLKC will vary and will depend upon the specific structure of the clock circuit including the voltage detection circuit 500. One skilled in the art will understand suitable structures for forming the decode logic 502.

Figure 6:
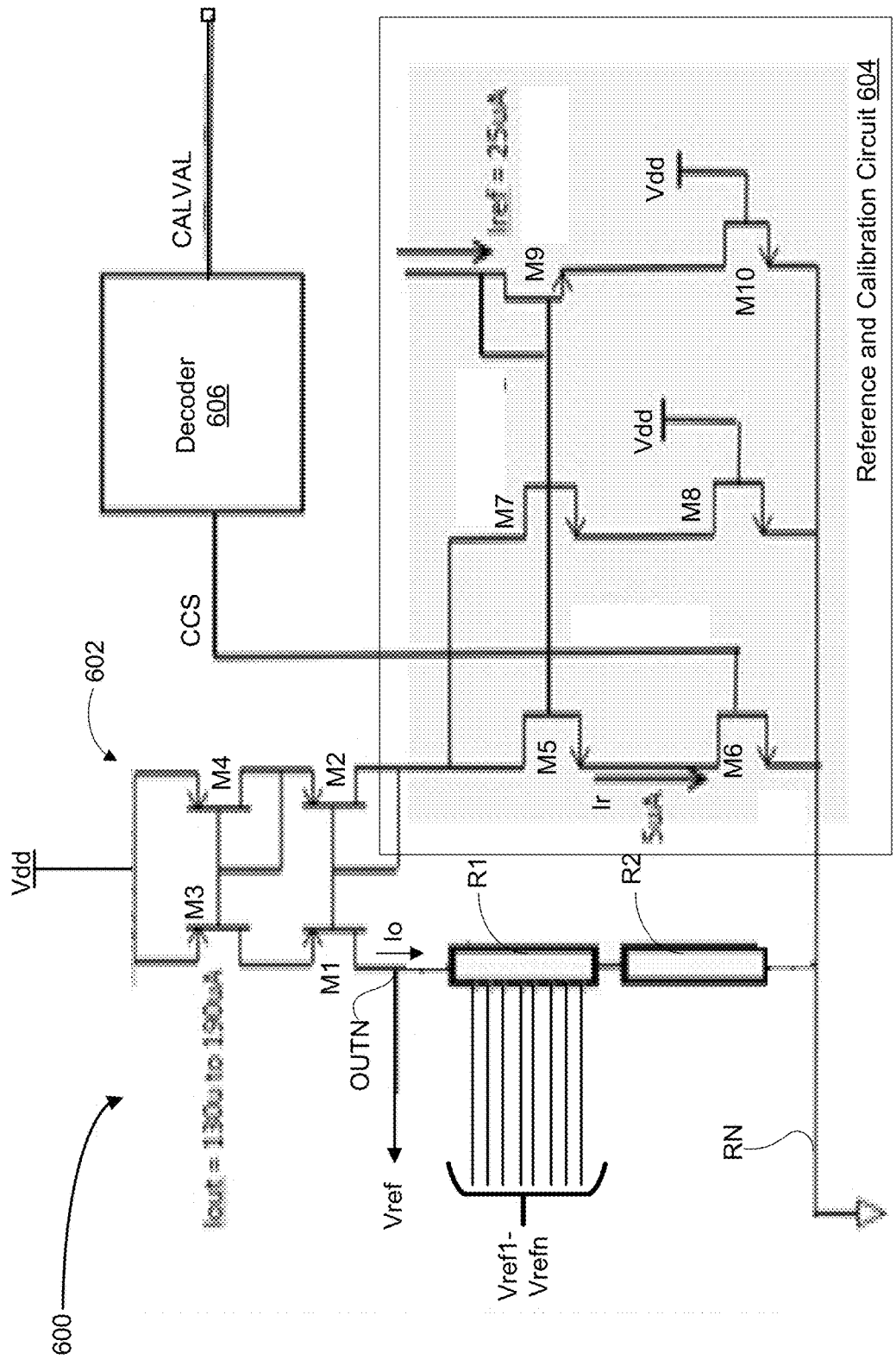
FIG. 6 is a more detailed schematic diagram of a reference voltage generation circuit according to an embodiment of the present disclosure.

FIG. 6 is a more detailed schematic diagram of a reference voltage generation circuit 600 according to an embodiment of the present disclosure. The reference voltage generation circuit 600 includes a cascode current mirror 602 formed by transistors M1-M4. A reference and calibration circuit 604 includes transistors M5-M10 coupled to receive a first reference current Iref from an external circuit (not shown), with this reference current being supplied through transistors M9 and M10 to generate a corresponding second reference current Ir through transistors M5 and M6. The second reference current Ir is the reference current of the current mirror 602, which mirrors the second reference current to provide an output current Io that flows through a first resistive element R1 and second resistive element R2 coupled in series between an output node OUTN and a reference voltage node RN.

The resistive element R1 includes a plurality of taps, with each tap being physically positioned along a length of the first resistive element to provide a corresponding one of the reference voltages Vref1-Vrefn. These reference voltages Vref1-Vrefn are then utilized by the group of comparators CMP1-CMPn, for example, in the embodiment of the voltage detection circuit 500 of FIG. 5. The reference voltage generation circuit 600 further includes a decoder 606 that receives a calibration value signal CALVAL having a value that functions to adjust or "trim" the value of the second reference current Ir. More specifically, the decoder 606 generates a current control signal CCS in response to the CALVAL signal, the current control signal being supplied to a gate of the transistor M6 in the reference and calibration circuit 604. The adjustment or change in the second reference current Ir results in a mirrored change in the output current Io which, in turn, adjust the values of the reference voltages Vref1-Vrefn.

Figure 7:
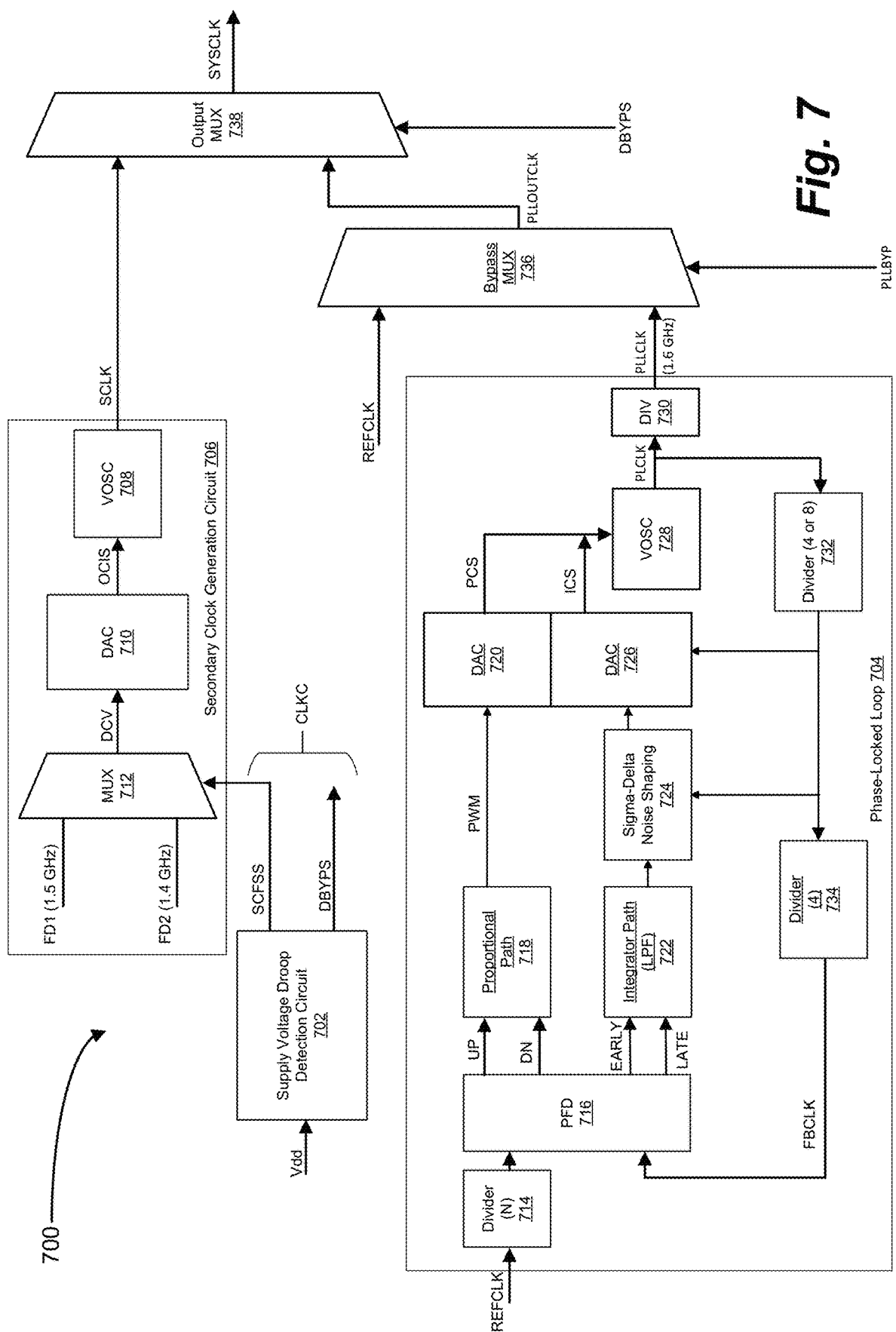
FIG. 7 is a more detailed functional block diagram of a clock circuit including a supply voltage droop detection circuit and providing a system clock signal according to a further embodiment of the present disclosure.

FIG. 7 is a more detailed functional block diagram of a clock circuit 700 including a supply voltage droop detection circuit 702 and operable to provide a system clock signal SYSCLK according to a further embodiment of the present disclosure. The clock circuit 700 includes a phase-locked loop (PLL) 704 that receives a reference clock signal REFCLK and generates, based on the reference clock signal, a PLL clock signal PLLCLK having a first frequency F1. The PLLCLK signal has a phase and frequency that are related to a phase and frequency of the REFCLK signal. A secondary clock generation circuit 706 generates a second clock signal SCLK having a second frequency F2 that is less than the first frequency F1 of the PLLCLK signal. The supply voltage droop detection circuit 702 is coupled to receive a supply voltage Vdd and detects a droop in the supply voltage, and generates a clock control signal CLKC having a value indicating whether a droop on the supply voltage has been detected. In the embodiment of FIG. 7, the clock control signal CLKC generated by the supply voltage droop detection circuit 702 includes a secondary clock frequency selection signal SCFSS and a droop detection bypass signal DBYPS. The secondary clock frequency selection signal SCFSS is applied to the secondary clock generation circuit 706 to set a value of the frequency F2 of the second clock signal SCLK while the droop detection bypass signal DBYPS is utilized in selecting whether the SCLK signal or the PLLCLK signal is provided as the system clock signal SYSCLK, as will be described in more detail below.

In the embodiment of FIG. 7 the secondary clock generation circuit 306 includes a variable oscillator (VOSC) 708 that generates the SCLK signal and a DAC 710 that supplies an oscillator control input signal OCIS to the variable oscillator. The DAC 710 generates the OCIS signal in response to a digital control value signal DCV supplied to the DAC from a multiplexer (MUX) 712. In the example embodiment of FIG. 7, the MUX 712 receives a first frequency drive signal FD1 and a second frequency drive signal FD2 having values that correspond to respective values for the frequency F2 of the SCLK signal generated by the VOSC 708. The MUX 712 also receives the secondary clock frequency selection signal SCFS generated by the droop detect circuit 702 and provides, based on the SCFSS signal, either the first or second frequency drive signal FD1, FD2 as the digital control value signal DCV that is supplied to the DAC 710.

In one embodiment of the clock circuit 700, the PLLCLK signal generated by the PLL 704 has a frequency of 1.6 GHz while the first frequency drive signal FD1 corresponds to a frequency of 1.5 GHz and the second frequency drive signal FD2 corresponds to a frequency of 1.4 GHz for the SCLK generated by the secondary clock generation 706. In embodiments of clock circuit 700 the variable oscillator 708 may be a ring oscillator, which may be a current-controlled or a voltage-controlled ring oscillator. The DAC 710 may be a monotonic DAC in embodiments of clock circuit 700.

The PLL 704 is a dual loop phase-locked loop in the embodiment of FIG. 7. A divider circuit 714 receives the reference clock signal REFCLK and divides the frequency of this clock signal by a factor of N, where N is an integer. The divided REFCLK signal is supplied as one input of a phase-frequency detector (PFD) 716 that determines a phase difference between the divided REFCLK signal and a feedback clock signal FBCLK that is a fed back version of the PLLCLK signal generated by the PLL 704, as will be described in more detail below. In response to the determined phase difference between the divided REFCLK signal and the FBCLK signal, the PFD 716 generates a pair of proportional control signals UP, DN and a pair of integrating control signals EARLY, LATE.

The control loop of the PLL 704 includes dual loops, namely a proportional loop and an integrating loop. A proportional path 718 receives the proportional control signals UP, DN and generates a digital pulse-width modulation (PWM) signal indicating the phase difference information in the proportional control signals UP, DN. A digital-to-analog converter (DAC) 720 receives the digital PWM signal and, in response to the supplied PWM signal, generates a proportional control signal PCS. An integrator path 722 receives the integrating control signals EARLY, LATE from the PFD 716 and functions to low pass filtering (LPF) these signals and output an integrated control signal. A sigma-delta noise shaping circuit 724 receives the integrated control signal from the integrator path 722 and provides noise shaping on the integrated control signal to shift quantization noise in the integrated control signal to a higher out-of-band frequency range, as will be understood by those skilled in the art. A digital-to-analog converter (DAC) 726 receives the noise shaped integrated control signal from the sigma-delta noise shaping circuit 724 and, in response to the noise shaped integrated control signal, generates an integral control signal ICS. In one embodiment of the clock circuit 700, the DAC 720 is a 6-bit monotonic DAC and the DAC 726 is an 11-bit monotonic DAC.

A variable oscillator (VOSC) 728 receives the proportional control signal PCS provided by the DAC 720 and the integral control signal ICS provide by the DAC 726. These control signals PCS, ICS are effectively summed and provided to the VOSC which, in turn, generates a phase locked clock signal PLCLK at the first frequency F1 where the value of the first frequency is determined by the sum of the provided PCS and ICS signals. In one embodiment, the VOSC 728 is a current-controlled ring oscillator with each of the PCS and ICS signals being a current and these currents being summed to control the value of the first frequency F1 of the generated PLCLK signal. A divider circuit 730 receives the PLCLK signal from the VOSC 728 and divides the PLCLK signal by a factor to output the PLLCLK signal that is generated by the PLL 704.

The PLCLK signal generated by the VOSC 728 is also fed back to a divider circuit 732 which, in turn, divides the PLCLK by a division factor D, where D=4 or 8 in the example embodiment of FIG. 7. This divided PLCLK signal from the divider circuit 732 is supplied to the DAC 726, which utilizes the signal in adjusting the value of the ICS signal to provide for fine control of the value of the frequency F1 of the PLCLK generated by the VOSC 728. The PCS signal provided by the DAC 720 provides for coarse control of the frequency F1 of the PLCLK signal and ensures the PLL 704 remains locked during normal operation. The ICS signal provided by the DAC 726 provides for fine tuning or adjustment of the frequency F1 of the PLCLK signal. A further divider circuit 734, which is indicated as having a division factor of 4 in the example of FIG. 7, receives the divided clock signal from the divider circuit 732. The divider circuit 734 divides the clock signal from divider circuit 732 to generate the feedback clock signal FBCLK that is fed back to the PFD 716.

A bypass multiplexer 736 receives the REFCLK signal supplied to the PLL 704 and also receives the PLLCLK signal generated by the PLL. External circuitry (not shown) supplies a phase-locked bypass signal PLLBYP to the bypass MUX 736 to provide either the REFCLK signal or PLLCLK signal as an output phase-locked clock signal PLLOUTCLK.

The bypass MUX 736 allows external circuitry including the clock circuit 700 to operate in a bypass mode of operation in which the PLLCLK signal generated by the PLL 704 is bypassed and instead is replaced with the REFCLK signal supplied to the PLL. An output multiplexer 738 receives the PLLOUTCLK signal from the MUX 736 and also receives the SCLK signal generated by the secondary clock generation circuit 706. The output MUX 738 selects one of the SCLK signal and the PLLOUTCLK signal to provide as the SYSCLK signal in response to the droop detection bypass signal DBYPS generated by the supply voltage droop detection circuit 702. In operation, when the droop detection circuit 702 detects no droop in the supply voltage Vdd, the droop detection circuit applies the DBYPS signal to the output MUX 738 to cause the MUX to output the PLLOUTCLK signal as the SYSCLK signal. Upon detecting a droop in the supply voltage Vdd, the droop detection circuit 702 applies the DBYPS signal to the output MUX 738 to cause the MUX to output the SCLK signal as the SYSCLK signal.

In another embodiment of the clock circuit 700, the functionality of the droop detection circuit 702 and secondary clock generation circuit 706 are integrated into the control loops of the PLL 704. In such an embodiment, upon detection of a droop in the supply voltage Vdd, the proportional path and integral path in the PLL 704 are broken or opened so that the proportional path 718 and noise shaping circuit 724 do not provide inputs to the DAC 720 and DAC 726. Instead, inputs to the DACs 720, 726 are provided by droop detection circuitry cause the PLL 704 to generate the PLLCLK signal having a new lower frequency for the duration of the droop. The values of the inputs supplied to the DACs 720, 726 in such an embodiment may be varied as a function of the level of the detected droop to thereby adjust specific value of the lower frequency PLLCLK signal. For example, the values of the inputs supplied to the DACs 720, 726 may be successively updated to thereby successively lower the frequency of the PLLCLK signal in response to detecting the supply voltage Vdd successively falling below different threshold levels.

In another embodiment of the clock circuit 700, the secondary clock generation circuit 706 may be integrated into the PLL 704, or external to the PLL, and may include a first DAC, a second DAC and a variable oscillator coupled in the same way as the DAC 720 DAC 726 and VOSC 728 in the PLL 704. The first DAC, second DAC and variable oscillator may be replicas of the DAC 720 DAC 726 and VOSC 728 in this embodiment.

Further Example Embodiments

In various embodiment, the present disclosure includes circuits, methods, and systems for reducing clock signal frequencies.

In one embodiment, the present disclosure includes a circuit, comprising: a phase-locked loop configured to receive a reference clock signal and to generate a first clock signal having a first frequency; a secondary clock generation circuit configured to generate a second clock signal having a second frequency lower than the first frequency; a voltage detection circuit coupled to a supply voltage and configured to detect a droop in the supply voltage; and a selection circuit coupled to the voltage detection circuit, wherein the selection circuit produces the first clock signal when the voltage detection circuit detects no droop in the supply voltage, and the selection circuit produces the second clock signal when the voltage detection circuit detects a droop in the supply voltage.

In one embodiment, the circuit further comprises a processor having a power supply input coupled to the supply voltage and a clock input coupled to the selection circuit to receive one of the first clock signal or second clock signal.

In one embodiment, the secondary clock generation circuit comprises a variable oscillator configured to receive an oscillator control input signal to generate the second clock signal.

In one embodiment, the secondary clock generation circuit is configured to produce a plurality of clock signal frequencies for the second clock signal in response to a clock control signal from the voltage detection circuit.

In one embodiment, the secondary clock generation circuit reduces the clock signal frequency of the second clock signal as the supply voltage decreases.

In one embodiment, the phase-locked loop comprises a proportional path and an integral path, the circuit further comprising: a first digital-to-analog converter coupled to an output of the voltage detection circuit and configured in the proportional path of the phase-locked loop; a second digital-to-analog converter coupled to the output of the voltage detection circuit and configured in the integral path of the phase-locked loop; wherein the first digital-to-analog converter and second digital-to-analog converter generate a first oscillator control input signal to a first variable oscillator to generate the first clock signal; a third digital-to-analog converter coupled to an output of the voltage detection circuit and configured in the proportional path of the phase-locked loop; a fourth digital-to-analog converter coupled to the output of the voltage detection circuit and configured in the integral path of the phase-locked loop; and wherein the third digital-to-analog converter and fourth digital-to-analog converter generate a second oscillator control input signal to a second variable oscillator to generate the second clock signal.

In one embodiment, the voltage detection circuit comprises: a plurality of resistors coupled in series between a first voltage node configured to receive a first reference voltage and a second reference voltage node, wherein reference nodes are defined at interconnections of the plurality of resistors; and a plurality of comparators, each of the plurality of comparators having a first input coupled to a corresponding reference node and a second input coupled to receive a sensing voltage indicating a value of the supply voltage.

In one embodiment, the phase-locked loop comprises a first variable oscillator configured to receive a first oscillator control input signal and to generate the first clock signal, and the secondary clock generation circuit comprises a second variable oscillator configured to receive a second oscillator control input signal and to generate the second clock signal.

In one embodiment, the first variable oscillator is configured in the phase locked loop and the first oscillator control input signal is generated in the phase locked loop, and wherein the second variable oscillator is configured in an open loop and the second oscillator control input signal is generated by a digital-to-analog converter.

In one embodiment, the second variable oscillator is a replica oscillator.

In one embodiment, the first and second oscillator control input signals are currents and the first and second variable oscillators are ring oscillators.

In one embodiment, the circuit further comprises at least one digital-to-analog converter configured to receive at least one signal from the voltage detection circuit and at least one signal from the phase-locked loop, and in accordance therewith, generate the first oscillator control input signal; and at least one digital-to-analog converter configured to receive at least one signal from the voltage detection circuit and at least one signal from the phase-locked loop, and in accordance therewith, generate the second oscillator control input signal.

In one embodiment, the secondary clock generation circuit selects a first digital signal for configuring a digital-to-analog converter to generate the second oscillator control input signal for the second variable oscillator.

In another embodiment, the present disclosure includes a circuit, comprising: at least one processor; a phase-locked loop configured to receive a reference clock signal and to generate a first clock signal having a first frequency; a secondary clock generation circuit configured to generate a second clock signal having a second frequency; a voltage detection circuit coupled to a supply voltage and configured to detect a droop in the supply voltage; and a selection circuit coupled to the voltage detection circuit, wherein at least one of the first frequency and the second frequency are reduced when the voltage detection circuit detects a droop in the supply voltage, and wherein the selection circuit switches between producing the first clock signal and the second clock signal in response to a control signal corresponding to a level of droop in the supply voltage from the voltage detection circuit.

In one embodiment, the first frequency is greater than the second frequency, wherein the second frequency is reduced as the supply voltage decreases In one embodiment, the selection circuit switches from producing the first clock signal to produce the second clock signal when the supply voltage droops below a first threshold voltage, and wherein the selection circuit switches from producing the second clock signal to produce the first clock signal when the supply voltage increases above the first threshold voltage.

In one embodiment, the first frequency is reduced from an initial frequency and the secondary clock generation circuit is turned on when the supply voltage droops below at least a first threshold voltage, wherein the selection circuit switches from producing the first clock signal to produce the second clock signal having the second frequency equal to the initial frequency when the supply voltage recovers above the first threshold voltage, and wherein the selection circuit switches from producing the second clock signal to produce the first clock signal when the phase-locked loop has stabilized the first clock signal to the initial frequency.

In another embodiment, the present disclosure includes a method of generating a clock for at least one processor, comprising: generating a first clock signal in a phase-locked loop having a first clock signal frequency; sensing a supply voltage on the at least one processor; selecting a second clock signal having a second clock signal frequency, less than the first clock signal frequency, from a secondary clock generation circuit when the supply voltage on the processor is below a first threshold; and reducing the second clock signal frequency as the supply voltage on the processor decreases.

In one embodiment, the method further comprises, in response to a reduction in the supply voltage, modifying a digital input to a digital-to-analog converter to change a control input signal coupled to a variable oscillator in the secondary clock generation circuit, and in accordance therewith, reducing the second clock signal frequency.

In one embodiment, the second clock signal frequency is reduced between a plurality of discrete clock signal frequencies as the supply voltage on the processor decreases.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:
1. A circuit, comprising:
a phase-locked loop configured to receive a reference clock signal and to generate a first clock signal having a first frequency;
a secondary clock generation circuit configured to generate a second clock signal having a second frequency lower than the first frequency;
a voltage detection circuit coupled to a supply voltage and configured to detect a droop in the supply voltage; and
a selection circuit coupled to the voltage detection circuit, wherein the selection circuit produces the first clock signal when the voltage detection circuit detects no droop in the supply voltage, and the selection circuit produces the second clock signal when the voltage detection circuit detects a droop in the supply voltage, and wherein the secondary clock generation circuit is configured to produce a plurality of clock signal frequencies for the second clock signal in response to a clock control signal from the voltage detection circuit.

2. The circuit of claim 1, further comprising a processor having a power supply input coupled to the supply voltage and a clock input coupled to the selection circuit to receive one of the first clock signal or second clock signal.

3. The circuit of claim 1, wherein the secondary clock generation circuit comprises a variable oscillator configured to receive an oscillator control input signal to generate the second clock signal.

4. The circuit of claim 1, wherein the secondary clock generation circuit reduces the clock signal frequency of the second clock signal as the supply voltage decreases.

5. The circuit of claim 1, wherein the phase-locked loop comprises a proportional path and an integral path, the circuit further comprising:
a first digital-to-analog converter coupled to an output of the voltage detection circuit and configured in the proportional path of the phase-locked loop;
a second digital-to-analog converter coupled to the output of the voltage detection circuit and configured in the integral path of the phase-locked loop;
wherein the first digital-to-analog converter and second digital-to-analog converter generate a first oscillator control input signal to a first variable oscillator to generate the first clock signal;
a third digital-to-analog converter coupled to an output of the voltage detection circuit and configured in the proportional path of the phase-locked loop;
a fourth digital-to-analog converter coupled to the output of the voltage detection circuit and configured in the integral path of the phase-locked loop; and
wherein the third digital-to-analog converter and fourth digital-to-analog converter generate a second oscillator control input signal to a second variable oscillator to generate the second clock signal.

6. The circuit of claim 1, wherein the voltage detection circuit comprises:
a plurality of resistors coupled in series between a first voltage node configured to receive a first reference voltage and a second reference voltage node, wherein reference nodes are defined at interconnections of the plurality of resistors; and
a plurality of comparators, each of the plurality of comparators having a first input coupled to a corresponding reference node and a second input coupled to receive a sensing voltage indicating a value of the supply voltage.

7. The circuit of claim 1, wherein the phase-locked loop comprises a first variable oscillator configured to receive a first oscillator control input signal and to generate the first clock signal, and the secondary clock generation circuit comprises a second variable oscillator configured to receive a second oscillator control input signal and to generate the second clock signal.

8. The circuit of claim 7, wherein the first variable oscillator is configured in the phase locked loop and the first oscillator control input signal is generated in the phase locked loop, and wherein the second variable oscillator is configured in an open loop and the second oscillator control input signal is generated by a digital-to-analog converter.

9. The circuit of claim 7, wherein the second variable oscillator is a replica oscillator.

10. The circuit of claim 7, wherein the first and second oscillator control input signals are currents and the first and second variable oscillators are ring oscillators.

11. The circuit of claim 7, further comprising:
at least one digital-to-analog converter configured to receive at least one signal from the voltage detection circuit and at least one signal from the phase-locked loop, and in accordance therewith, generate the first oscillator control input signal; and
at least one digital-to-analog converter configured to receive at least one signal from the voltage detection circuit and at least one signal from the phase-locked loop, and in accordance therewith, generate the second oscillator control input signal.

12. The circuit of claim 7, wherein the secondary clock generation circuit selects a first digital signal for configuring a digital-to-analog converter to generate the second oscillator control input signal for the second variable oscillator.

13. A circuit, comprising:
at least one processor;
a phase-locked loop configured to receive a reference clock signal and to generate a first clock signal having a first frequency;
a secondary clock generation circuit configured to generate a second clock signal having a second frequency;
a voltage detection circuit coupled to a supply voltage and configured to detect a droop in the supply voltage; and
a selection circuit coupled to the voltage detection circuit,
wherein at least one of the first frequency and the second frequency are reduced when the voltage detection circuit detects a droop in the supply voltage, and wherein the selection circuit switches between producing the first clock signal and the second clock signal in response to a control signal corresponding to a level of droop in the supply voltage from the voltage detection circuit, and
wherein the first frequency is reduced from an initial frequency and the secondary clock generation circuit is turned on when the supply voltage droops below at least a first threshold voltage, wherein the selection circuit switches from producing the first clock signal to produce the second clock signal having the second frequency equal to the initial frequency when the supply voltage recovers above the first threshold voltage, and wherein the selection circuit switches from producing the second clock signal to produce the first clock signal when the phase-locked loop has stabilized the first clock signal to the initial frequency.

14. The circuit of claim 13, wherein the first frequency is greater than the second frequency, wherein the second frequency is reduced as the supply voltage decreases.

15. The circuit of claim 13, wherein the selection circuit switches from producing the first clock signal to produce the second clock signal when the supply voltage droops below a first threshold voltage, and wherein the selection circuit switches from producing the second clock signal to produce the first clock signal when the supply voltage increases above the first threshold voltage.

16. A method of generating a clock for at least one processor, comprising:
generating a first clock signal in a phase-locked loop having a first clock signal frequency;
sensing a supply voltage on the at least one processor;

selecting a second clock signal having a second clock signal frequency, less than the first clock signal frequency, from a secondary clock generation circuit when the supply voltage on the processor is below a first threshold;

reducing the second clock signal frequency as the supply voltage on the processor decreases; and in response to a reduction in the supply voltage, modifying a digital input to a digital-to-analog converter to change a control input signal coupled to a variable oscillator in the secondary clock generation circuit, and in accordance therewith, reducing the second clock signal frequency.

17. The method of claim 16, wherein the second clock signal frequency is reduced between a plurality of discrete clock signal frequencies as the supply voltage on the processor decreases.

\* \* \* \* \*